United States Patent [19]
Sonntag

[11] Patent Number: 5,760,488
[45] Date of Patent: Jun. 2, 1998

[54] VEHICLE HAVING A FUEL CELL OR BATTERY ENERGY SUPPLY NETWORK

[75] Inventor: Josef Sonntag, Illertissen, Germany

[73] Assignee: Daimler-Benz AG, Stuttgart, Germany

[21] Appl. No.: 594,752

[22] Filed: Jan. 31, 1996

[30] Foreign Application Priority Data

Feb. 4, 1995 [DE] Germany ............ 195 03 749.9

[51] Int. Cl.⁶ .................................... B60K 28/14
[52] U.S. Cl. .................... 307/10.1; 180/65.1; 307/9.1; 320/49
[58] Field of Search ................ 307/9.1, 10.8, 307/43, 63, 87; 320/49; 323/260, 299, 363; 180/65.1, 65.2, 65.3

[56] References Cited

U.S. PATENT DOCUMENTS

| | | | |
|---|---|---|---|
| 4,253,056 | 2/1981 | Chaudhary | 324/509 |
| 5,146,397 | 9/1992 | Fruhling | 363/74 |
| 5,238,083 | 8/1993 | Horie et al. | 180/65.1 |
| 5,436,509 | 7/1995 | Migdal | 307/9.1 |
| 5,565,711 | 10/1996 | Hagiwara | 307/10.1 |
| 5,569,966 | 10/1996 | Schantz et al. | 307/10.1 |

FOREIGN PATENT DOCUMENTS

| | | |
|---|---|---|
| 0 435 371 | 7/1991 | European Pat. Off. |
| 2 268 270 | 4/1974 | France. |
| 688 497 | 2/1940 | Germany. |
| 121 858 | 11/1975 | Germany. |
| 229 904 | 11/1985 | Germany. |
| 33 39 890 | 12/1989 | Germany. |
| 613 313 | 9/1979 | Switzerland. |

Primary Examiner—Richard T. Elms
Assistant Examiner—Peter Ganjian
Attorney, Agent, or Firm—Evenson, McKeown, Edwards & Lenahan, P.L.L.C.

[57] ABSTRACT

The invention relates an energy supply network for a vehicle powered by a fuel cell or by a battery. The energy supply network according to the invention is configured as an IT-network in which the consuming devices linked with the load current circuit are electrically connected with the vehicle body by a low impedance. An insulation monitoring device which consists of a measuring-bridge balancing stage and a buffer amplifier stage is connected between the load current circuit and the vehicle body.

4 Claims, 2 Drawing Sheets

5,760,488

1

VEHICLE HAVING A FUEL CELL OR BATTERY ENERGY SUPPLY NETWORK

BACKGROUND AND SUMMARY OF THE INVENTION

This invention relates to an energy supply network for a vehicle such as an electric car, powered by a fuel cell or by a battery.

A vehicle having an energy supply system of this generic type is disclosed, for example, in German Patent Document DE 33 39 890 C2. In that device, a connection of the battery as well as a connection of one of the current-consuming elements fed by the battery, and therefore one of the two load current circuit lines, is connected to the potential of the vehicle body.

According to a VDE Regulation (Regulation of the Association of German Electrotechnical Engineers), when DC voltages in such networks exceed a maximal contact voltage of 120 V, protection must be provided against the possibility of indirect contact. In addition, in the case of fuel-cell-operated or battery-operated motor vehicles, there is increased danger of insulation defects because of the mechanical stress in the form of vibrations. In battery or fuel cell systems (made, for example, of photoelectromagnetic fuel cells), electric leakage currents may occur because of the gas and fluid circulation; such leakage currents may cause dangerous contact voltages between different operating devices. In addition, they may cause corrosion There is also the danger that arcs may occur, acting as an ignition source. Because of the system-caused leakage currents, fault current (FI) or fault voltage (FU) protection switches cannot be used as a protection against contact voltage. In the case of fuel cell arrangements which are used in steady-state systems, the corresponding system parts can be grounded directly. This is not possible, however, for nonsteady mobile systems, such as vehicles; hence different protective measures are required.

One type of limited energy supply network with its own transformer or generator is known as a so-called IT-network. See draft of standard concerning DIN VDE 0100, Part 410 A3, Section 413, June 1989. In an IT-network, excessive contact voltage is prevented by connecting together all consuming devices that are to be protected, by means of a protective grounding conductor from which the load current circuit is insulated. The insulating resistance (that is, the resistance between the load lines and ground) of the load circuit (that is, the power supply circuit) is continuously checked in a conventional manner by means of an insulation monitoring apparatus.

German Patent Document DD 121 858 discloses a ground monitoring device for DC networks in which a network point with a ground potential is created by way of a voltage divider, and is connected with ground potential by way of a resistor. In an arrangement described in German Patent Document DE 688 497, a relay is used to monitor the insulation resistance on a direct voltage network for trackless trolley buses. The relay connects one of two oppositely connected exciting coils between one of the two trolley arms and the vehicle mass. Swiss Patent Document CH 613 313 A5 discloses a device for monitoring the insulation of an ungrounded DC network by means of a bridge circuit situated between the network conductors. One branch of the bridge is formed by auxiliary resistances, while the other is formed of insulation resistances of the network conductors to the ground. A monitoring circuit which detects asymmetry of the insulation resistances contains a coupling link for the non-galvanic signal transmission whose input element emits a signal depending on the above-mentioned electric asymmetry, which is detected by an output element and is converted to an electric recognition signal.

One object of the invention is to provide fuel cell or battery energy supply network for a vehicle which ensures operational safety with respect to high contact potentials and ignition sources endangering fire safety, and is protected against excessive corrosion.

This and other objects and advantages are achieved by the energy supply network according to the invention, in which the load circuit of the fuel-cell-fed or battery-fed energy supply system is constructed in the manner of an IT-network. One load current line of the network is situated above, and the other below, the potential of the vehicle body, and the vehicle components linked with the load circuit are electrically connected with the vehicle body by a low impedance, for example, a resistance of less than 1 $\Omega$.

In a further embodiment of the invention, the insulation resistance between the load circuit lines and the vehicle body can be monitored by means of a measuring-bridge balancing stage, with a buffer amplifier which processes its measurement signal. This arrangement thus requires only one measuring-bridge balancing stage and one buffer amplifier to monitor the insulation of both load current circuit lines. In still another embodiment of the invention, the load circuit is connected with the vehicle body by means of a sufficiently high-impedance that, in the case of fuel cell or battery leakage currents below a predetermined threshold value, the occurrence of excessive leakage currents, on the one hand, and an unintentional response of the insulation monitoring, on the other, are prevented.

In another embodiment of the invention, the insulation monitoring device has one or several trimming potentiometers in order to balance the load current circuit voltages fed to the measuring-bridge balancing stage with respect to the vehicle body potential, and/or to adapt the measuring range of the measuring-bridge balancing stage to presettable alarm limits or the buffer amplifier measuring range.

Other objects, advantages and novel features of the present invention will become apparent from the following detailed description of the invention when considered in conjunction with the accompanying drawings.

DETAILED DESCRIPTION OF THE DRAWINGS

Figure 1:
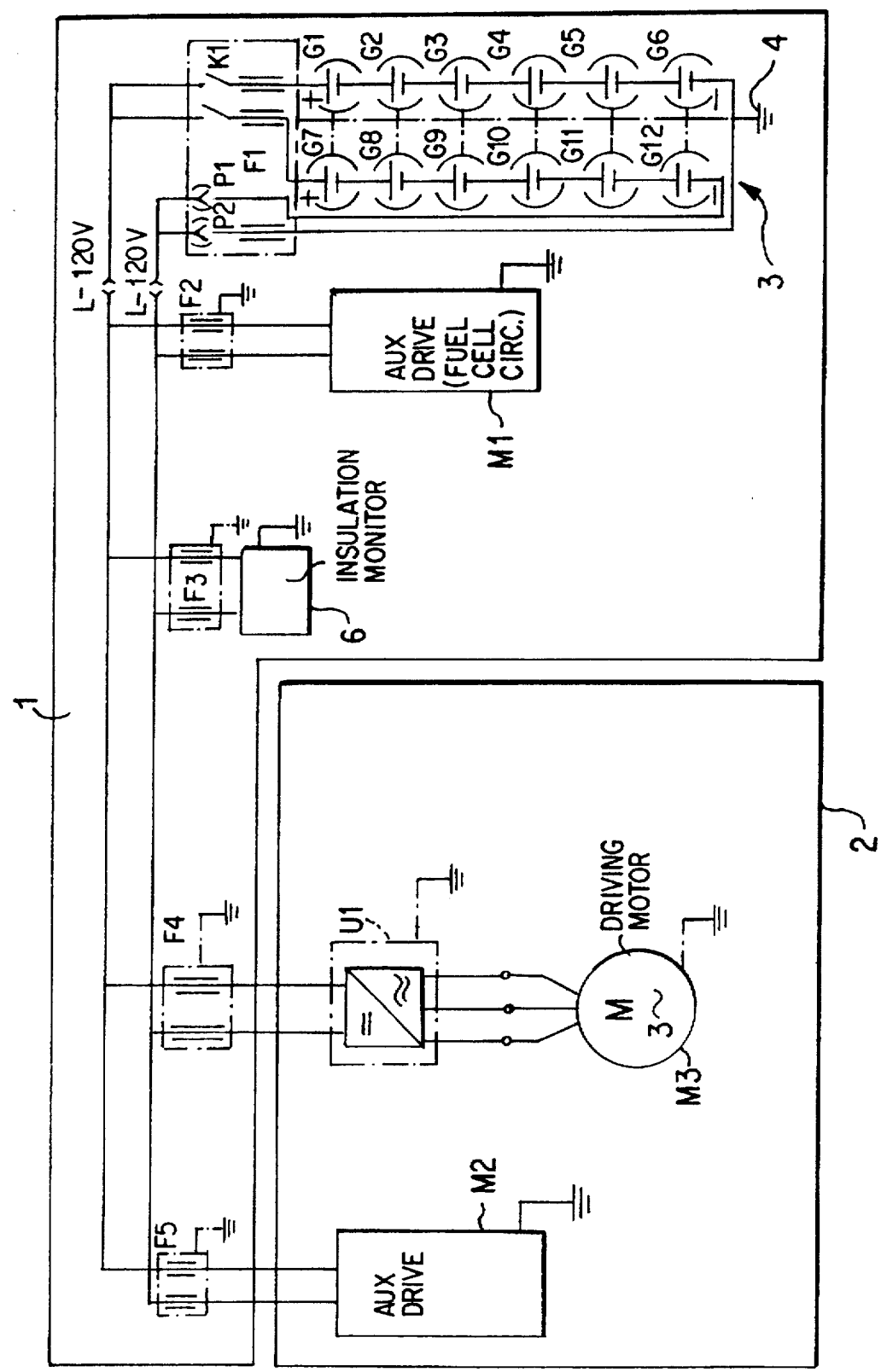
FIG. 1 is a schematic diagram of a fuel-cell-fed energy supply network for an electric vehicle, according to the invention.

The fuel-cell-fed energy supply network of an electric vehicle illustrated in FIG. 1 includes a current generating element 1 and a consuming portion 2 of the vehicle. The electric energy source of the current generating system 1 contains a fuel cell stack 3, which consists of two parallel rows of six PEM (Proton Exchange Membrane) fuel cells (G1 to G12) respectively. (As noted previously, however, the invention is equally applicable to vehicles powered by batteries.) The positive outputs of the two fuel cell rows are connected by way of fuses and a switching element (K1) to a positive supply voltage connection from which the positive line ($L^+$) of the load circuit for the electric vehicle branches off. Analogously, the negative outputs of the two fuel cell rows are connected by way of fuses (F1) and current measuring devices (P1, P2) jointly to a negative voltage supply connection from which the negative line (L⁻) of the load circuit branches off. A two-pole separation by the switching element (K1) is preferred.

The load circuit is configured as an IT-network. That is, all current-consuming system parts are fed by way of two load circuit lines (L⁺, L⁻) which are connected with the vehicle body by means of a high impedance insulation monitoring device 6 while, as a protective measure against an excessive contact potential, all system parts to be protected are connected together by way of a low impedance (with a residual resistance which is lower than 1 Ω) with the vehicle body. In FIG. 1, the vehicle body is therefore symbolized by the symbol for the ground 4.

The IT-network is designed symmetrically with respect to the vehicle body potential; that is, the voltage (−120 V) on the negative load current circuit line (L⁻) corresponds to the negative value of the voltage (+120 V) on the positive load current circuit line (L⁺). (In this case, without limiting the generality, the vehicle body potential is assumed to be 0 V. (In the case of a defect (for example, in the fuel cell stack 3) which causes a leakage to flow from a load current circuit line (L⁺ or L⁻) to the vehicle body 4 and back by way of the high-impedance resistance of the insulation monitoring device 6, this load circuit balancing has the advantage that such leakage current is very low in the case of a voltage difference of 240 V and an insulation resistance of above 10 k Ω.) If, however, a load circuit line were applied to the vehicle body potential, as is usually done in vehicle power supply systems, then in the case of a defect a short-circuit current may result from the other load current circuit line to the vehicle body, corresponding to a voltage difference of 240 V and a resistance close to 0 Ω. Since leakage currents frequently cause corrosion, such corrosion can be kept lower by the preferred load current circuit balancing than in an asymmetrical case. This is so because of the halved voltage difference of 120 V (instead of 240 V with a one-sided grounding) and the high-impedance of the insulation monitoring between the load current circuit (L', L⁻) and the chassis, which is not possible in the case of a one-sided grounding.

Still within the current generating system, the load current circuit (L', L⁻) electrically supplies auxiliary drives (M1) with three-phase alternating current by means of respective fuses (F2) and DC/AC-converters (not separately depicted). These auxiliary drives (M1) are required for the fuel cell fluid circulation. In the same manner, the DC load circuit, with the fuel cells (G1 to G12) as electric energy sources, supplies (by way of front-mounted fuses (F4, F5)) auxiliary drives (M2) arranged in the consuming portion 2 of the vehicle, and also supplies the driving motor (M3) of the electric vehicle with three-phase alternating current by means of a front-connected DC/AC-converter (U1).

As noted previously, the fuel-cell-fed energy supply network designed as an IT-network is equipped with an insulation monitoring device 6 in the fuel generating system portion 1 This device 6 is connected by way of front-mounted fuses (F3) to the load current circuit lines (L⁺, L⁻), and forms a high-impedance connection of the two load current circuit lines (L⁺, L⁻) with respect to the vehicle body potential 4, preferably with a resistance value greater than 10 k Ω. The insulation resistance of the load circuit lines (L', L⁻) with respect to the vehicle chassis 4, which is provided and monitored by the insulation monitoring device 6, has an impedance which is sufficiently high to prevent the insulation monitoring device from responding to low fuel cell leakage currents below a presettable threshold value of approximately 1 mA to 5 mA. On the one hand, it also ensures that leakage currents which may occur in the case of a defect multiplied by the grounding resistance of all system parts connected with the chassis is lower than the maximally acceptable contact voltage of 120 V, on the other hand, A maximum leakage current of below 100 mA is preferred.

Figure 2:
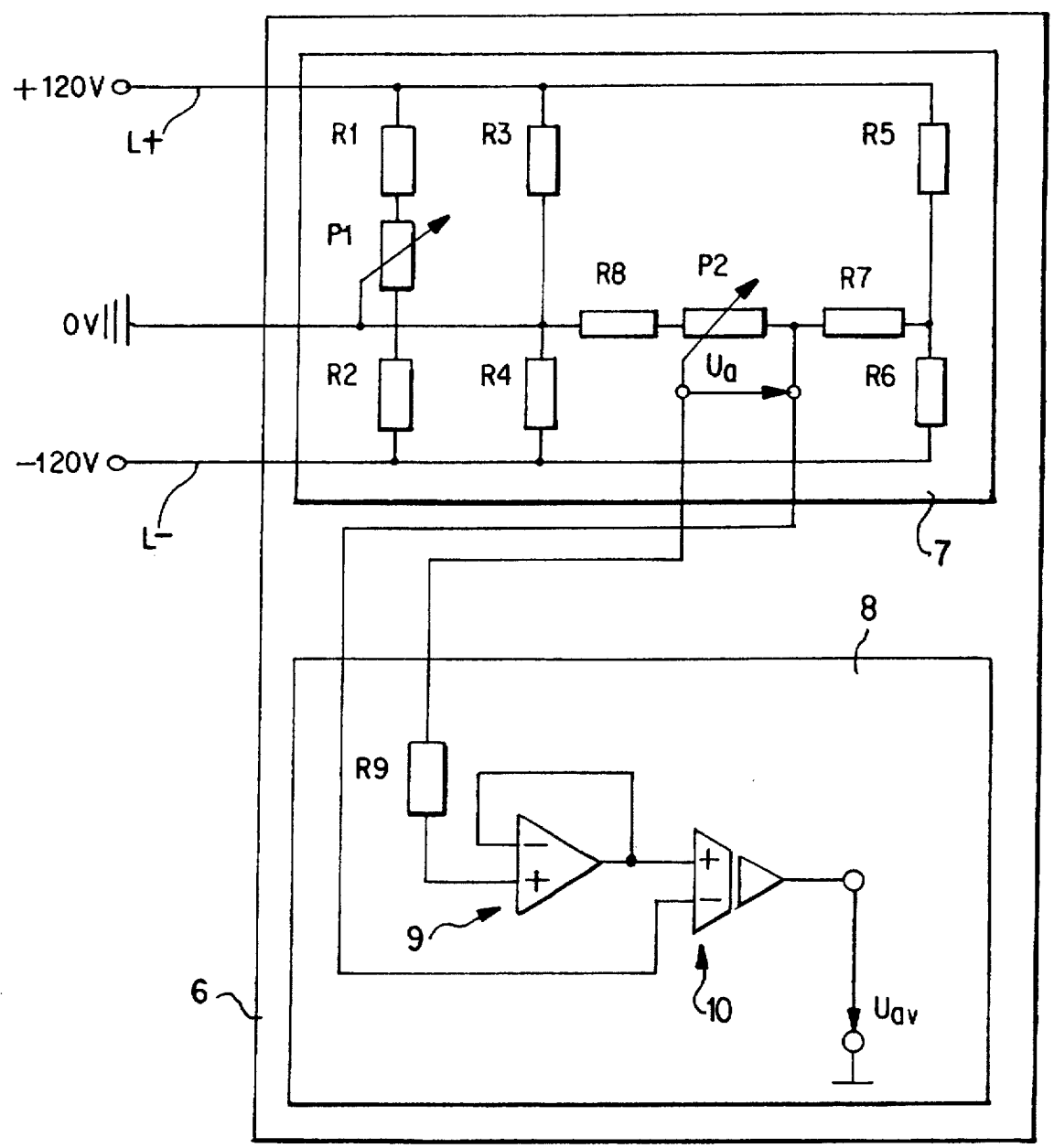
FIG. 2 is a schematic diagram of an insulation monitoring device provided in the fuel-cell-fed energy supply network of FIG. 1.

FIG. 2 illustrates in greater detail the circuiting of the device 6 for monitoring the insulation resistance. It consists of a measuring-bridge balancing stage 7 and a measurement-signal processing buffer amplifier stage 8 connected behind it. The two load circuit lines (L⁺, L⁻), which normally are at +120 V or −120 V, as well as the 0 V vehicle body potential are supplied to an input of measuring-bridge balancing stage 7. A first voltage divider connected between the load current circuit potentials inputs, has two large (equal) resistances (R3, R4) of, for example, 10 k Ω respectively. A second voltage divider, also connected between the load current circuit potentials, consists of two large (equal) resistances (R1, R2) which have higher-impedances than those of the first voltage divider, as well as of a trimming potentiometer (P1) situated in-between. Like the center point of the first voltage divider, the tap of the trimming potentiometer (P1) is connected to the vehicle body potential. This configuration permits precise balancing of the system voltage by the trimming potentiometer (P1).

A third voltage divider, with resistances (R5, R6) corresponding, for example, to the those (R1, R2) of the second voltage divider, is connected in parallel with the first two voltage dividers, between the load current circuit potentials (+120 V, −120 V). A measuring bridge in the form of a series connection consisting of a first, lower-impedance resistance (R8) (for example, 4.7 k Ω), a second trimming potentiometer (P2) and a higher-impedance resistance (R7) (for example, 33 k Ω), is connected between the respective center point of this third voltage divider and that of the first voltage divider.

The output voltage ($U_4$) of the measuring-bridge balancing stage 7 is tapped between the center tap of the second trimming potentiometer (P2) and the potentiometer connection to the higher-impedance resistance (R7), and indicates deviations from the voltage balancing, and thus possible insulation resistance changes.

This output voltage ($U_S$) of the measuring-bridge balancing stage 7 is supplied to the buffer amplifier stage 8. A connection is provided directly to the inverting input of a buffer amplifier 10, while the other input branch is connected by a resistance (R9) to the non-inverting input of an operational amplifier 9 (which is configured as an impedance converter by a back-coupling of its output signal to the inverting input). An output voltage signal ($U_{OV}$), which is used for the insulation resistance monitoring, is provided at the output of the buffer amplifier 10. The operational amplifier 9 of the impedance converter provides a high-impedance input for the buffer amplifier 10, thereby preventing excessive loading of the measuring bridge (R8, P2, R7). By a corresponding adjustment of the second trimming potentiometer (P2), the voltage ($U_a$) which appears can be adjusted and is imaged by the buffer amplifier stage 8 onto the output signal range of the buffer amplifier 10 (for example, 0 V–10 V).

As long as there is no defect, as illustrated, no voltage appears at the measuring bridge (R8, P2, R7) since both input nodes are at 0 V. When a defect occurs, however, the two load circuit voltages become asymmetrical relative to the zero potential, and a non-zero voltage appears at the measuring bridge (R8, P2, R7), so that the defect can be detected if, for example, a short circuit occurs between the positive load current circuit line (L⁺) and ground, above the measuring bridge (R8, P2, R7), the same voltage of 120 V will appear above the resistance (R5), whereas no voltage appears above the resistance (R3) The measuring-bridge potentiometer (P2) and the buffer amplifier stage 8, convert the changed measuring-bridge voltage to a correspondingly changed, detectable output signal voltage of the buffer amplifier stage (8). Functionally analogous conditions are found for the other defects which may occur.

As indicated, the device 6 for monitoring the insulation resistance, which operates according to the principle of a balanced measuring bridge, requires only a single measurement-signal processing buffer amplifier stage 8 for both load current circuit lines (L⁺, L⁻). It is, of course, also possible, in a motor vehicle control unit, to establish one or several alarm phases by presetting corresponding voltage threshold values For example, in the case of a first lower deviation, the triggering of a pre-alarm may take place by means of a visual and/or acoustic warning signal and, when a larger deviation occurs, the triggering of a main alarm may take place, with the system being switched off.

By implementing the energy supply network as an IT-network with insulation monitoring, it is possible to achieve reliable protection from excessive contact voltages and contact currents, therefore counteracting the occurrence of excessive corrosion caused by fuel cell leakage currents. Additional advantages are fire and operational safety. It is clear that an energy supply network according to the invention can be used in an analogous manner also for vehicles types other than electric vehicles, in which the feeding of such a network by fuel cells or by other types of batteries is provided Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Energy supply network for a vehicle powered by a fuel cell or a battery, comprising:

a load circuit configured as an IT-network, which has first and second load current circuit lines connected to supply electric current to current consuming parts of systems of said vehicle, said first load current circuit line being coupled to a potential greater than a potential of a vehicle body of said vehicle, and said second load current circuit line being coupled to a potential less than the potential of said vehicle body, wherein the first and second current circuit lines are coupled to the vehicle body by means of a first impedance;

said current consuming parts connected to said load current circuit are electrically coupled to the vehicle body by means of a second impedance; and said first impedance has a high impedance value relative to said second impedance, which has a low impedance value.

2. Energy supply network according to claim 1, further comprising a device for monitoring the insulation resistance between the load current circuit and the vehicle body, said device containing a measuring-bridge balancing stage and a measurement-signal processing buffer amplifier stage.

3. Energy supply network according to claim 2, wherein the load current circuit is electrically connected with the vehicle body by means of a high impedance, so that no leakage currents occur which are larger than 100 mA, and the device for monitoring the insulation resistance does not respond to fuel cell or battery leakage currents below a threshold value between 1 mA and 5 mA.

4. Energy supply network according to claim 2, wherein the measuring-bridge balancing stage has at least one trimming potentiometer to balance supplied voltages of the load circuit lines with respect to the vehicle body potential, a buffer amplifier stage for generating an output signal within a predetermined measurement range, for monitoring said insulation resistance, and presettable alarm limits for comparison with said output signal.

* * * * *